(12) United States Patent
Kang et al.

(10) Patent No.: US 8,953,397 B2
(45) Date of Patent: Feb. 10, 2015

(54) SEMICONDUCTOR DEVICE AND METHOD OF OPERATING THE SAME

(75) Inventors: Tai Kyu Kang, Icheon-si (KR); Sang Hyun Song, Bucheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 341 days.

(21) Appl. No.: 13/601,609

(22) Filed: Aug. 31, 2012

(65) Prior Publication Data

US 2013/0107647 A1    May 2, 2013

(30) Foreign Application Priority Data

Oct. 27, 2011    (KR) .......................... 10-2011-0110582

(51) Int. Cl.
*G11C 7/00*   (2006.01)
*G11C 16/22*  (2006.01)
*G11C 16/06*  (2006.01)
*G11C 16/32*  (2006.01)

(52) U.S. Cl.
CPC .............. *G11C 16/225* (2013.01); *G11C 16/06* (2013.01); *G11C 16/32* (2013.01)
USPC ............... 365/191; 365/189.011; 365/189.14; 365/189.09; 365/233.14

(58) Field of Classification Search
USPC ................. 365/191, 189.011, 189.14, 189.09, 365/233.14
See application file for complete search history.

(56) References Cited

U.S. PATENT DOCUMENTS

| 2010/0122097 A1* | 5/2010 | Cohen .......................... 713/300 |
| 2010/0214853 A1* | 8/2010 | Kang ....................... 365/189.07 |
| 2010/0290288 A1* | 11/2010 | Kang ....................... 365/185.18 |

FOREIGN PATENT DOCUMENTS

| JP | 06-068280 A | 11/1994 |
| KR | 1020120037188 A | 4/2012 |

* cited by examiner

*Primary Examiner* — Toan Le
(74) *Attorney, Agent, or Firm* — William Park & Associates Patent Ltd.

(57) ABSTRACT

The present disclosure relates to a semiconductor device and a method of operating the semiconductor device. The semiconductor device includes a ROM for storing a program algorithm, an erase algorithm, a reading algorithm, and a reset algorithm and outputting ROM data corresponding to a selected algorithm, a program counter for outputting a ROM address to the ROM so as to sequentially operate the selected algorithm, an internal circuit for performing an operation corresponding to the selected algorithm in response to a plurality of internal circuit control signals in response to the ROM data, and a reset circuit for stopping progress of a running algorithm by initializing the program counter in response to a reset command input from an outside, and performing the reset algorithm.

20 Claims, 3 Drawing Sheets

SEMICONDUCTOR DEVICE AND METHOD OF OPERATING THE SAME

CROSS-REFERENCE TO RELATED APPLICATION

This application is based on and claims priority from Korean Patent Application No. 10-2011-0110582, filed on Oct. 27, 2011, with the Korean Intellectual Property Office, the disclosure of which is incorporated herein in its entirety by reference.

BACKGROUND

The present invention relates generally to a semiconductor device and a method of operating the same, and more particularly to a semiconductor device capable of preventing over-spec when inputting a reset command and a method of operating the same.

A semiconductor device includes a microcontroller for controlling operations of circuits included therein.

The microcontroller controls the operations of the internal circuits in response to an operation command input to the semiconductor device. When the semiconductor device performs the operation in response to an external command, the semiconductor device may receive a reset command instructing the stop of the operation and the return to an initial state from a user. In this case, when the microcontroller executes the reset command amid a running operation, the semiconductor device may be in an abnormal state due to a resulting operation error.

In order to prevent the abnormal state, the semiconductor device may identify whether the reset command is input during a running operation by way of a reset check code.

For example, when the reset command is input from the outside during a running program operation by the external command, the program operation up to a reset check code is performed, and an initialization operation is performed thereafter. The reset check code determines whether or not a reset command is provided.

A plurality of reset check codes exists for a program operation, a reading operation, and an erase operation, but positions of the reset check codes may be different.

Accordingly, when the reset command is input from the outside, a time tRST at which the reset command is input and the time when an operation such as the program operation, the reading operation, or the erase operation, is finally completed, is not always synchronized, thereby generating over-spec in the device.

SUMMARY

The present disclosure provides a semiconductor device having the same reset time regardless of the state of a running operation by resetting a program counter within a microcontroller and performing a reset check code of an algorithm stored in a ROM when a reset command is input from the outside, and a method of operating the same.

An embodiment of the present invention provides a semiconductor device including: a ROM for storing a program algorithm, an erase algorithm, a reading algorithm, and a reset algorithm and outputting ROM data corresponding to a selected algorithm; a program counter for outputting a ROM address to the ROM so as to sequentially operate the selected algorithm; an internal circuit to perform an operation corresponding to the selected algorithm in response to a plurality of internal circuit control signals in response to the ROM data; and a reset circuit to stop progress of a running algorithm by initializing the program counter in response to a reset command input from an outside and performing the reset algorithm.

Another embodiment of the present invention provides a semiconductor device including: a microcontroller to output a plurality of internal circuit control signals in response to commands input from an outside; an internal circuit to perform a program operation, an erase operation, or a reading operation in response to the plurality of internal circuit control signals; and a reset circuit to control the microcontroller so as to stop a running algorithm and to perform a reset algorithm when a reset command is input from the outside.

Another embodiment of the present invention provides a method of operating a semiconductor device, including: performing one algorithm among a program algorithm, a reading algorithm, and an erase algorithm in response to an operation command input from an outside; initializing a program counter to move to a first line syntax of the one algorithm when a reset command is input from the outside; determining whether a reset signal is input through a reset check code recorded in the first line syntax; and performing a reset algorithm when it is determined that the reset signal is input.

In response to the various embodiments of the present invention, when the reset command is input from the outside, the reset check code of the algorithm stored in the ROM is performed by resetting the program counter within the microcontroller, thereby having the same reset time regardless of the state of a running operation, thereby preventing over-spec of the semiconductor device in the reset operation.

One reset check code may be stored in the algorithm within the ROM, so that the efficiency of the semiconductor device may be improved as the multiple sub routines for performing the reset operation may be unified into one sub routine.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Hereinafter, an embodiment of the present invention will be described with reference to the accompanying drawings in detail. However, the present invention is not limited to an embodiment disclosed below and may be implemented in various forms. The embodiment is provided only for illustrative purposes and for full understanding of the scope of the present invention by those skilled in the art.

Figure 1:
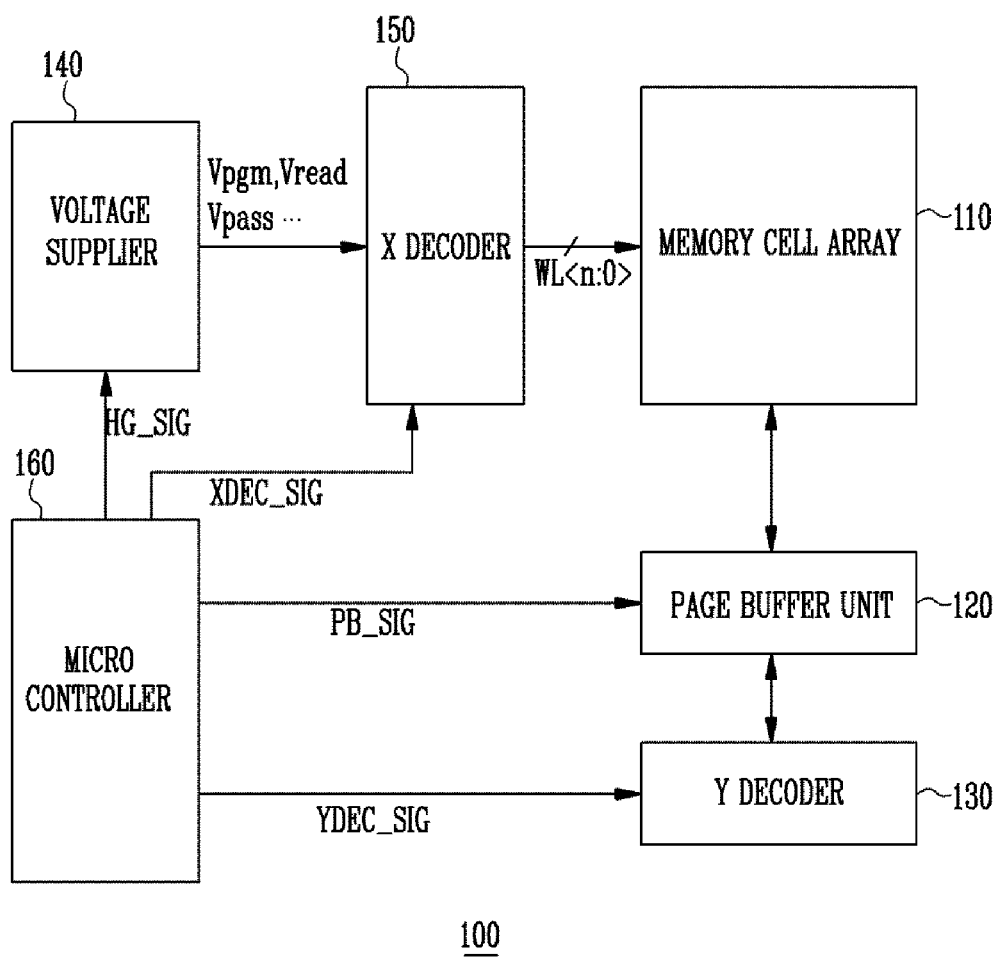
FIG. 1 is a block diagram illustrating a semiconductor device in response to an embodiment of the present invention.

FIG. 1 is a block diagram illustrating a semiconductor device in response to an embodiment of the present invention.

Referring to FIG. 1, the semiconductor device includes a memory cell array 110, a page buffer unit 120, a Y encoder 130, a voltage supplier 140, an X decoder 150, and a microcontroller 160.

The memory cell array 110 includes a plurality of memory cells in which data may be stored.

The page buffer unit 120 includes a plurality of page buffers connected with a plurality of bit lines of the memory cell array 110. Each of the page buffers temporarily stores program data transmitted through the Y decoder 130, controls the potential of a corresponding bit line in a program operation in response to page buffer control signals PB_SIG, senses the potential of the corresponding bit line in a reading operation, temporarily stores the read data, and then outputs the stored data to the Y decoder 130.

The Y decoder 130 transmits program data input through a data line to a page buffer corresponding to a column address in the program operation in response to Y decoder control signals YDEC_SIG, and outputs the read data transmitted from the page buffer to the data line in the reading operation.

The voltage supplier 140 generates operation voltages (e.g., a program voltage, a reading voltage, and a pass voltage) necessary for each operation in response to voltage supplier control signals HG_SIG.

The X decoder 150 transmits the operation voltages generated in the voltage supplier 140 to word lines WL<n:0> of the memory cell array 110 in response to X decoder control signals XDEC_SIG.

The memory cell array 110, the page buffer unit 120, the Y decoder 130, the voltage supplier 140, and the X decoder 150 are circuits to perform internal operations in the semiconductor device, and they may be defined as internal circuits.

The microcontroller 160 generates and outputs the page buffer control signals PB_SIG, the Y decoder control signals YDEC_SIG, the voltage supplier control signals HG_SIG, and the X decoder control signals XDEC_SIG in response to a command input from the outside. When the reset command is input from the outside, the algorithm is re-performed from the first line in which a reset syntax is stored in a ROM by initializing a program counter included in the microcontroller 160, so that a running operation is stopped to perform the reset operation.

Figure 2:
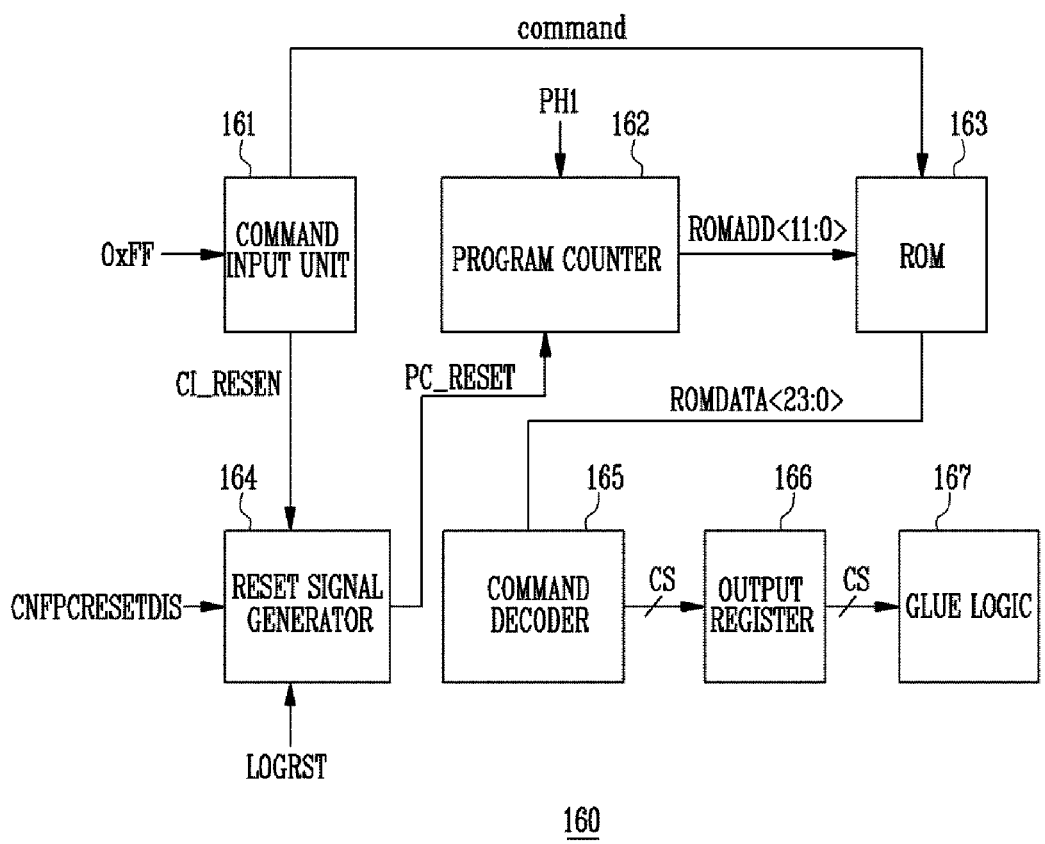
FIG. 2 is a block diagram illustrating a microcontroller illustrated in FIG. 1 in detail.

FIG. 2 is a block diagram illustrating the microcontroller illustrated in FIG. 1 in detail.

Referring to FIG. 2, the microcontroller 160 includes a command input unit 161, a program counter 162, a ROM 163, a reset signal generator 164, a command decoder 165, an output register 166, and a glue logic 167.

The command input unit 161 generates a command signal in response to a command input from the outside and outputs the generated command signal to the ROM 163. When a reset command 0xFF is input from the outside, the command input unit 161 outputs a reset enable signal CI_RESEN to the reset signal generator 164.

The program counter 162 outputs a ROM address ROMADD<11:0> sequentially increasing in the program operation, the reading operation, or the erase operation of the semiconductor device in response to a state signal PH1. The program counter 162 is initialized in response to a program counter reset signal PC_RESET and outputs an initial ROM address ROMADD<0>.

The ROM 163 stores the algorithm corresponding to the program operation, the reading operation, and the erase operation of the semiconductor device, and a reset check code is recorded in the first line syntax of each algorithm. The ROM 163 executes the algorithm corresponding to the program operation, the reading operation or the erase operation in response to the command signal output from the command input unit 161, and sequentially outputs ROM data ROMDATA<23:0> corresponding to a syntax of each algorithm in response to the ROM address ROMADD<11:0> output from the program counter 162.

The reset signal generator 164 outputs the program counter reset signal PC_RESET in response to the reset enable signal CI_RESEN. The reset signal generator 164 is initialized in response to a circuit initialization signal LOGRST, and inactivates the program counter reset signal PC_RESET regardless of the reset enable signal CI_RESEN in response to a test signal CNFPCRESETDIS.

The command decoder 165 outputs a plurality of control signals CS by decoding the ROM data ROMDATA<23:0> received from the ROM 163.

The output register 166 temporarily stores the plurality of control signals CS and then sequentially outputs the stored control signals CS to the glue logic 167.

Referring to FIG. 1, the glue logic 167 generates and outputs the page buffer control signals PB_SIG, the Y decoder control signals YDEC_SIG, the voltage supplier control signals HG_SIG, and the X decoder control signals XDEC_SIG by using the plurality of control signals CS received from the output register 166.

Figure 3:
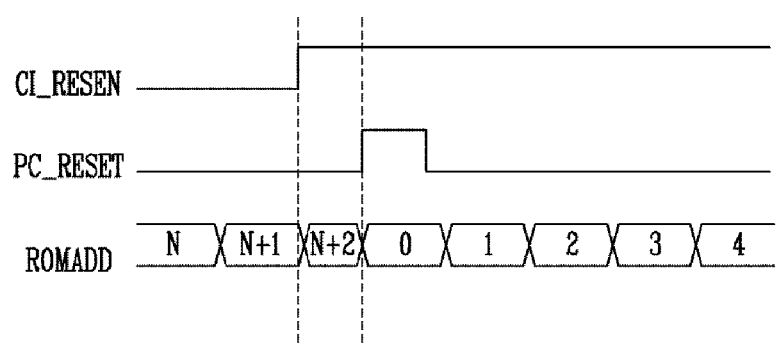
FIG. 3 is a waveform diagram of signals for illustrating an operation of a microcontroller illustrated in FIG. 2.

FIG. 3 is a waveform diagram of signals for illustrating an operation of a microcontroller illustrated in FIG. 2.

Figure 4:
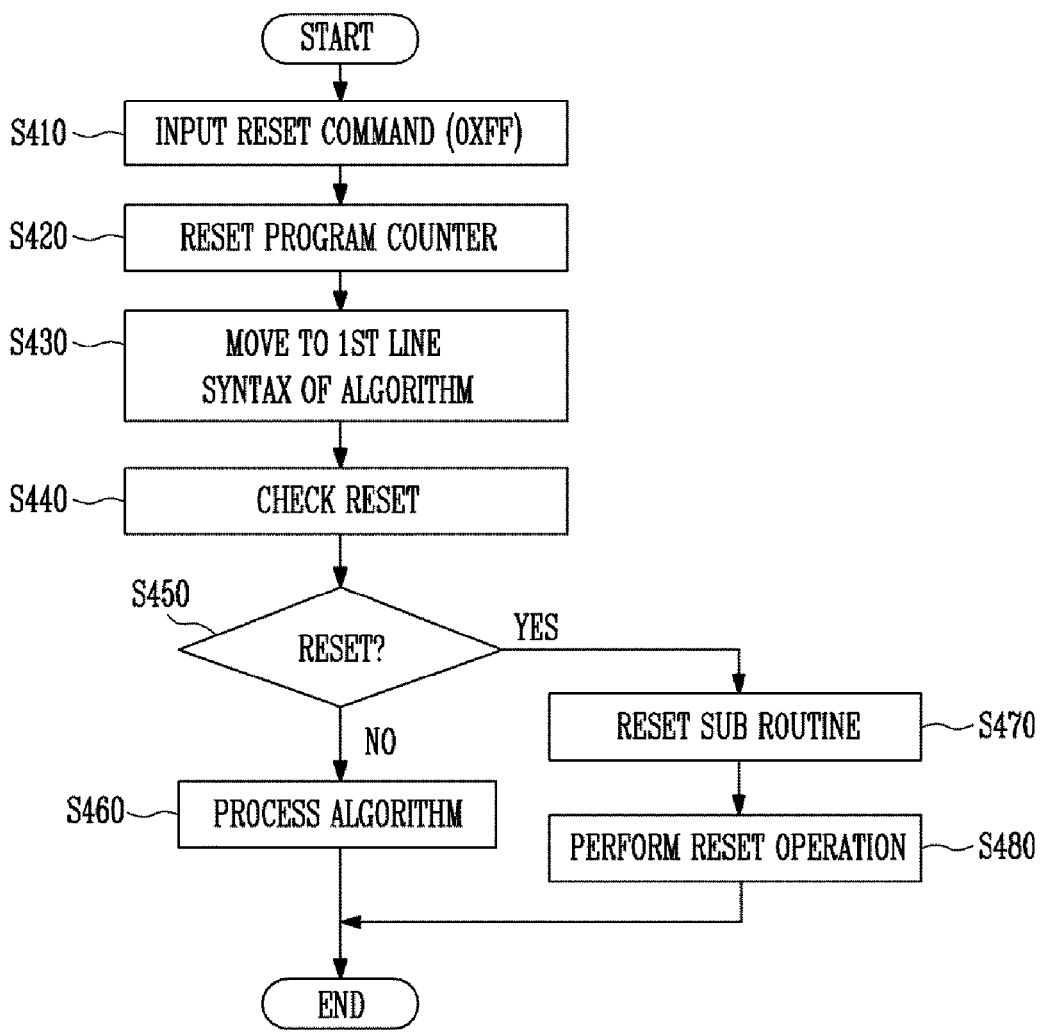
FIG. 4 is a flowchart illustrating an operation of a semiconductor device in response to an embodiment of the present invention.

FIG. 4 is a flowchart illustrating an operation of a semiconductor device in response to an embodiment of the present invention.

The operation of the semiconductor device in response to an embodiment of the present invention will be described with reference to FIGS. 1 to 4.

A case in which a reset command is input during a running program operation will be described below.

Specifically, an operation of the semiconductor device for performing the program operation before the input of the reset command will be first described below.

In the program operation, when a program command is input from the outside, a program algorithm stored in the ROM 163 is executed, so that ROM data ROMDATA<23:0> is sequentially output in response to ROM address ROMADD<11:0>.

The glue logic 167 generates and outputs the page buffer control signals PB_SIG, the Y decoder control signals YDEC_SIG, the voltage supplier control signals HG_SIG, and the X decoder control signals XDEC_SIG corresponding to the program operation in response to the control signals CS in response to the ROM data ROMDATA<23:0>.

The internal circuits of the memory cell array 110, the page buffer unit 120, the Y decoder 130, the voltage supplier 140, and the X decoder 150 perform the program operation for programming data in the memory cell array 110 in response to the page buffer control signals PB_SIG, the Y decoder control signals YDEC_SIG, the voltage supplier control signals HG_SIG, and the X decoder control signals XDEC_SIG.

The step S410 for inputting a reset command is described below.

When a reset command 0XFF is input from the outside, the command input unit 161 outputs a reset enable signal CI_RESEN at a high voltage level. The reset signal generator 164 outputs a program counter reset signal PC_RESET at a corresponding high voltage level for a predetermined time in response to the reset enable signal CI_RESEN at the high voltage level.

The step S420 for resetting the program counter is described below.

The program counter 162 is initialized in response to the program counter reset signal PC_RESET and outputs an initial ROM address ROMADD<0>.

The step S430 for moving to the first line syntax of the algorithm is described below.

The ROM 163 moves to a reset check code recorded in the first line syntax of a running algorithm in response to the initial ROM address ROMADD<0> output from the program counter 162.

The step S440 for checking the reset is described below.

A reset check operation corresponding to the reset check code stored in the first line syntax of the algorithm stored in the ROM 163 is performed.

The step S450 for determining the reset is described below.

It is determined whether the reset command is input from the outside by the performance of the reset check operation corresponding to the reset check code.

The step S460 for processing the algorithm is described below.

When it is determined that the reset command is not input from the outside by the performance of the reset check operation corresponding to the reset check code, the running program algorithm is sequentially re-performed from the beginning.

The step S470 for moving to a reset sub routine is described below.

When it is determined that the reset command is input from the outside by the performance of the reset check operation corresponding to the reset check code, the ROM moves to the reset sub routine in which the ROM data for the reset operation is stored.

8) The step S480 for performing the reset operation is described below.

After moving to the reset sub routine, the ROM outputs the ROM data ROMDATA<23:0> for the reset operation. The glue logic sequentially turns off the page buffer control signals PB_SIG, the Y decoder control signals YDEC_SIG, the voltage supplier control signals HG_SIG, and the X decoder control signals XDEC_SIG corresponding to the program operation in response to control signals CS in response to the ROM data ROMDATA<23:0>, to terminate the currently running program operation.

As described above, in response to the present invention, when the reset command is input from the outside during the internal operation, the reset check code is re-performed from the first line syntax of the algorithm by initializing the program counter, thereby having the same reset time regardless of the state of a currently running operation. Accordingly over-spec of the semiconductor device in the reset operation may be prevented.

One reset check code may be stored in each algorithm stored in the ROM, so that the efficiency of the semiconductor device may be improved as the multiple sub routines for performing the reset operation may be unified into one sub routine.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A semiconductor device comprising:
  a ROM configured to store a program algorithm, an erase algorithm, a reading algorithm, and a reset algorithm and to output ROM data corresponding to a selected algorithm;
  a program counter configured to output a ROM address to the ROM so as to operate the selected algorithm;
  an internal circuit configured to perform an operation corresponding to the selected algorithm in response to a plurality of internal circuit control signals according to the ROM data; and
  a reset circuit configured to stop progress of a running algorithm by initializing the program counter in response to a reset command input from an outside, and performing the reset algorithm.

2. The semiconductor device of claim 1, wherein a reset check code is stored in a first line syntax of the program algorithm, the erase algorithm, and the reading algorithm.

3. The semiconductor device of claim 2, wherein the ROM is configured to perform the reset algorithm when it is determined that the reset command is input by the reset check code.

4. The semiconductor device of claim 1, wherein the reset circuit comprises a reset signal generator configured to output a program counter reset signal in response to the reset command.

5. The semiconductor device of claim 4, wherein the program counter is configured to output an initial ROM address in response to the program counter reset signal.

6. The semiconductor device of claim 1, wherein the ROM is configured to output the ROM data corresponding to the program algorithm, the erase algorithm, or the reading algorithm in response to an operation command input from the outside.

7. The semiconductor device of claim 6, further comprising:
  a command decoder configured to output a plurality of control signals in response to the ROM data; and
  a glue logic configured to output the plurality of internal circuit control signals for controlling the internal circuit in response to the plurality of control signals.

8. The semiconductor device of claim 7, further comprising:
  an output register configured to temporarily store the plurality of control signals; and
  a command input unit configured to generate the command input to send to the ROM.

9. The semiconductor device of claim 1, wherein the internal circuit comprises:
  a memory cell array including a plurality of memory cells;
  a page buffer unit configured to store program data or sense program states of the plurality of memory cells, and coupled to bit lines of the memory cell array;
  a voltage supplier configured to generate multiple operation voltages; and
  an X decoder configured to selectively transmit the multiple operation voltages to the memory cell array.

10. The semiconductor device of claim 9, wherein the internal circuit further comprises a Y decoder configured to transmit program data to the page buffer or output read data.

11. A semiconductor device comprising:
  a microcontroller configured to output a plurality of internal circuit control signals in response to commands input from an outside;
  an internal circuit configured to perform a program operation, an erase operation, or a reading operation in response to the plurality of internal circuit control signals; and
  a reset circuit configured to control the microcontroller so as to stop a running algorithm and perform a reset algorithm when a reset command is input from the outside.

12. The semiconductor device of claim 11, wherein the microcontroller comprises:

a ROM configured to store a program algorithm, an erase algorithm, a reading algorithm, and a reset algorithm and output a selected algorithm in response to the commands input from the outside as ROM data in response to a ROM address;

a program counter configured to generate the ROM address; and a glue logic configured to output the plurality of internal circuit control signals for controlling the internal circuit in response to the ROM data.

13. The semiconductor device of claim 12, further comprising:

an output register configured to temporarily store the plurality of control signals; and a command input unit configured to generate the command input to send to the ROM.

14. The semiconductor device of claim 12, wherein a reset check code is recorded in a first line syntax of each of the program algorithm, the erase algorithm, and the reading algorithm.

15. The semiconductor device of claim 12, wherein the reset circuit comprises a reset signal generator configured to output a program counter reset signal in response to the reset command.

16. The semiconductor device of claim 15, wherein the program counter outputs an initial ROM address in response to the program counter reset signal.

17. The semiconductor device of claim 12, wherein the ROM is configured to perform the reset algorithm when it is determined that the reset command is input by the reset check code.

18. The semiconductor device of claim 11, wherein the internal circuit comprises:

a memory cell array including a plurality of memory cells;

a page buffer unit configured to store program data or sense program states of the plurality of memory cells and coupled to bit lines of the memory cell array;

a voltage supplier configured to generate multiple operation voltages; and an X decoder configured to selectively transmit the multiple operation voltages to the memory cell array.

19. The semiconductor device of claim 18, wherein the internal circuit further comprises a Y decoder configured to transmit program data to the page buffer or output read data.

20. A method of operating a semiconductor device, comprising:

performing one algorithm among a program algorithm, a reading algorithm, and an erase algorithm in response to an operation command input from an outside;

initializing a program counter and moving to a first line syntax of the one algorithm when a reset command is input from the outside;

determining whether or not a reset signal is input through a reset check code recorded in the first line syntax; and performing a reset algorithm when it is determined that the reset signal is input.

* * * * *